United States Patent [19]

Miyakawa et al.

[11] 4,144,587

[45] Mar. 13, 1979

[54] COUNTING LEVEL "1" BITS TO MINIMIZE ROM ACTIVE ELEMENTS

[75] Inventors: Tadashi Miyakawa, Yokohama; Masayoshi Nakane, Ayase; Masafumi Watanabe, Kawasaki; Yoshio Osaka, Yokohama, all of Japan

[73] Assignee: Tokyo Shibaura Electric Co., Ltd., Kawasaki, Japan

[21] Appl. No.: 818,015

[22] Filed: Jul. 22, 1977

[30] Foreign Application Priority Data

Jul. 22, 1976 [JP] Japan ................................ 51-87492
Jul. 22, 1976 [JP] Japan ................................ 51-87502

[51] Int. Cl.² .................... G11C 17/00; G11C 7/00
[52] U.S. Cl. ................................. 365/94; 365/104; 365/189
[58] Field of Search ................ 365/94, 103, 104, 189

[56] References Cited

U.S. PATENT DOCUMENTS

| | | | |
|---|---|---|---|
| 3,609,708 | 9/1971 | Cragon et al. | 365/94 |
| 3,618,052 | 11/1971 | Kwei et al. | 340/173 SP |
| 3,678,475 | 7/1972 | Jordan et al. | 365/104 |
| 3,909,808 | 9/1975 | Cochran et al. | 365/104 |
| 3,986,180 | 10/1976 | Cade | 365/104 |

*Primary Examiner*—Stuart N. Hecker
*Attorney, Agent, or Firm*—Finnegan, Henderson, Farabow & Garrett

[57] ABSTRACT

A semiconductor memory device, wherein a logic level-converting circuit is provided on a chip on which a mask read only memory (M-ROM) is formed; where more than half the number of information bits being stored in the ROM have a logic level of "1", active elements are formed in those cells of the ROM which correspond to information bits having a logic level of "0"; and a connection changeover circuit block is provided by the same process as used in forming the active element in order to connect the logic level-converting circuit to the output terminal of the ROM.

2 Claims, 16 Drawing Figures

COUNTING LEVEL "1" BITS TO MINIMIZE ROM ACTIVE ELEMENTS

This invention relates to a semiconductor memory device and more particularly to a semiconductor fixed memory device and a method of manufacturing the same.

Where semiconductor fixed memory devices of different types, or the so-called read only memories (hereinafter abbreviated as "ROM") having different memory patterns are manufactured, that the manufacturing processes which extends from the start to the formation on a semiconductor chip of a pattern in which a memory matrix having memory cells formed of, for example, resistors and transistors or gates of transistors are arranged in the form of a matrix is carried out through the common processes for different memory patterns of ROMs. Active elements are formed in the memory cells of the memory matrix according to the user's specification. Hitherto, the active elements have been provided in those of the memory cells which correspond to information bits having a logic level of "1". Therefore, where many of the signals being stored in the ROM have a logic level of "1", then a large number of active elements naturally have to be formed. In the case of the M-ROM, an increased number of active elements makes it necessary to bore those parts of the ROM chip corresponding to the memory cells with numerous apertures for the purpose of making active connections. The need for forming many apertures accordingly decreases the yield of the ROM, thereby resulting in not only the high cost of the ROM but also the reduced reliability thereof.

It is accordingly the object of this invention to provide a semiconductor memory device improved in yield and reliability and also a method of manufacturing the same.

According to an aspect of this invention, there is provided a semiconductor memory device (including a method of manufacturing the same), wherein the number of information bits having a logic level of "1" and the number of those having a logic level of "0" all being stored in a semiconductor memory cell are counted in advance; where the number of information bits having a logic level of "1" exceeds half the total number of all information bits being stored in the semiconductor memory device, then, active elements are formed in those of the memory cells which correspond to information bits having a logic level of "0"; and the connection of the contacts of a connection changeover logic circuit formed on the same chip as the memory matrix is so controlled as to supply an output signal read out of the memory matrix to a logic level-converting circuit block formed on the chip.

This invention can be more fully understood from the following detailed description when taken in conjunction with the accompanying drawings, in which:

FIG. 1 is a block circuit diagram of a semiconductor memory device according to one embodiment of this invention;

FIG. 2 indicates the arrangement of a connection changeover circuit block included in the semiconductor memory device;

Figure 5:
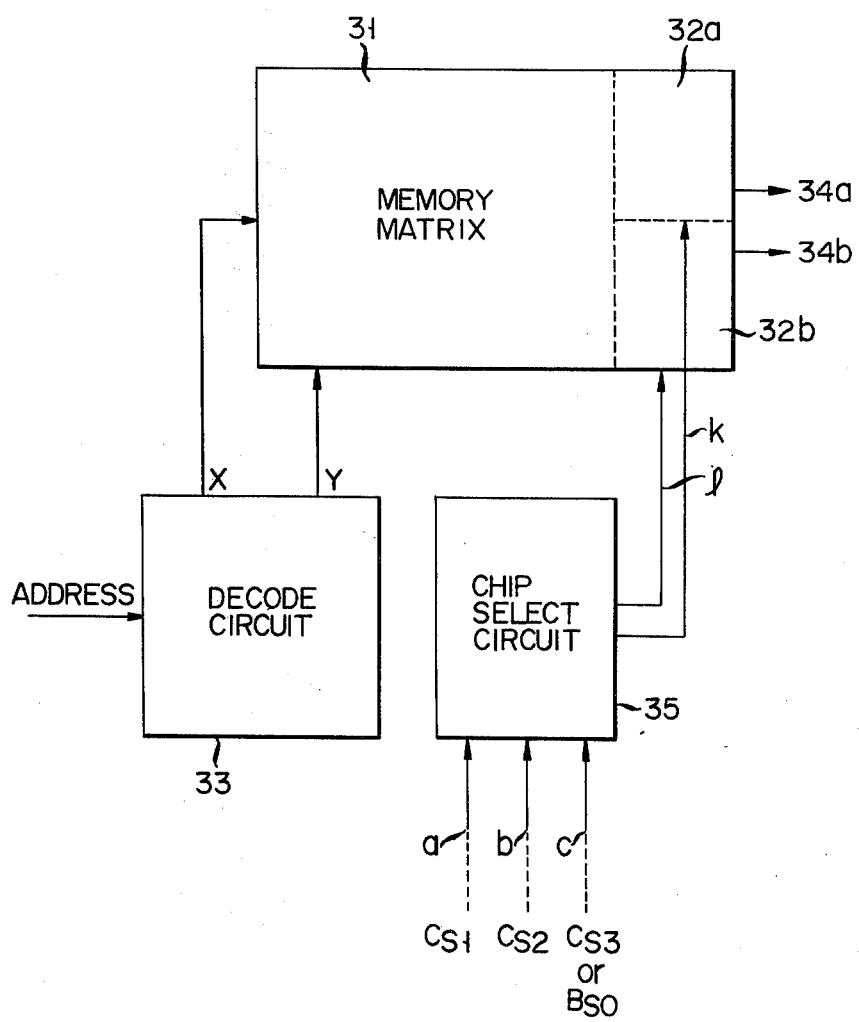
FIG. 5 is a block circuit diagram of a semiconductor memory device according to another embodiment of the invention.
Figure 6:
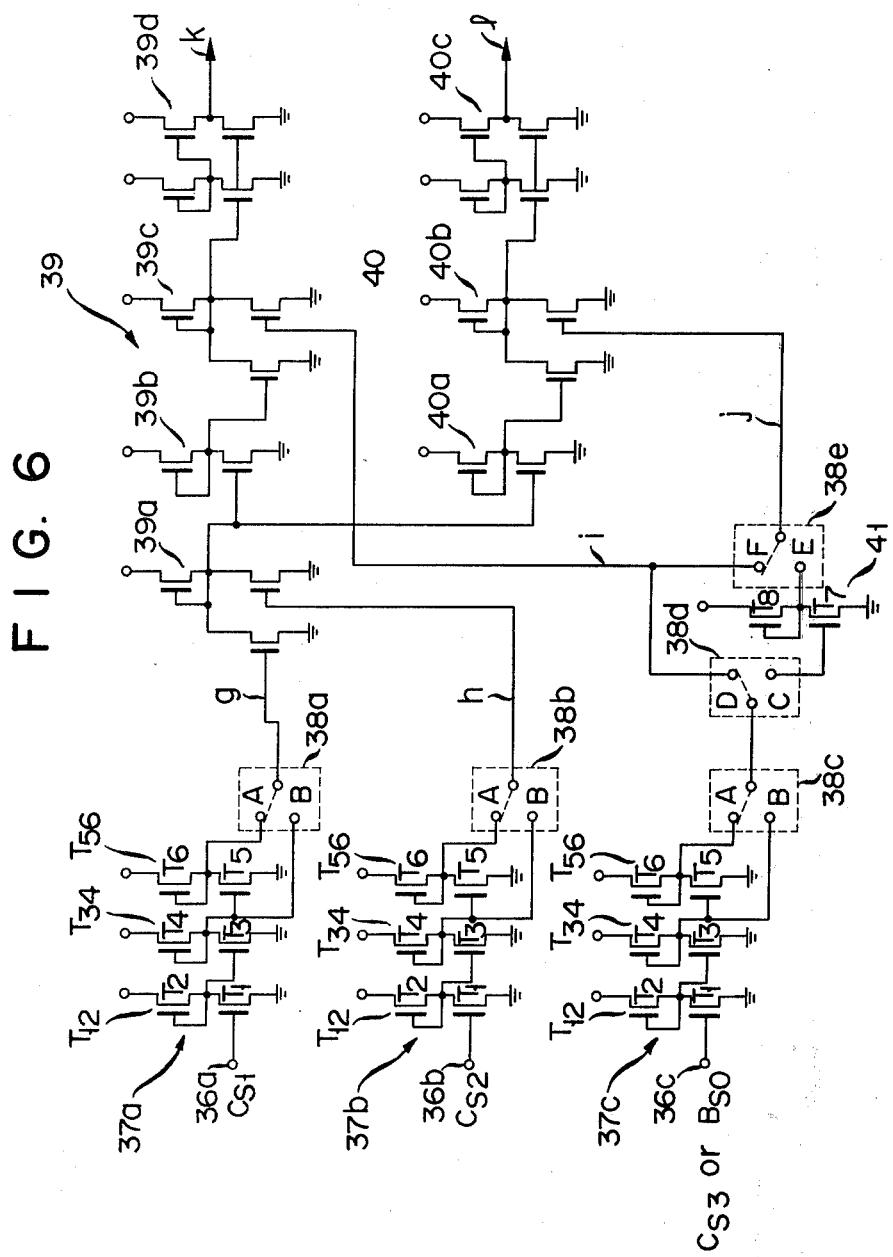
FIG. 6 shows a diagram of a chip select circuit included in FIG. 5.
Figure 8A:
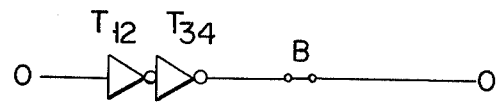
Figure 8B:
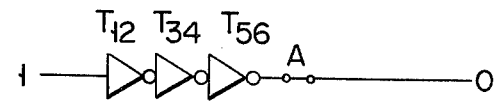
Figure 8C:
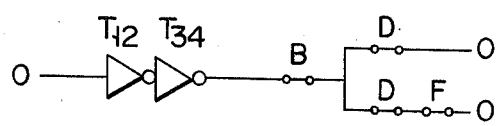
Figure 8D:
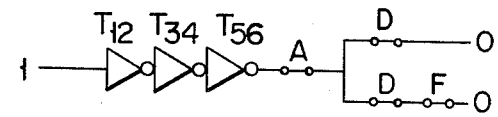
Figure 8E:
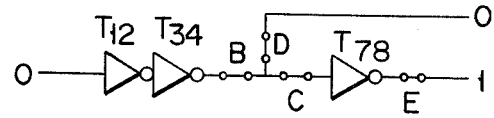
Figure 8F:
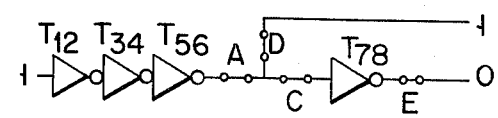
Figure 9:
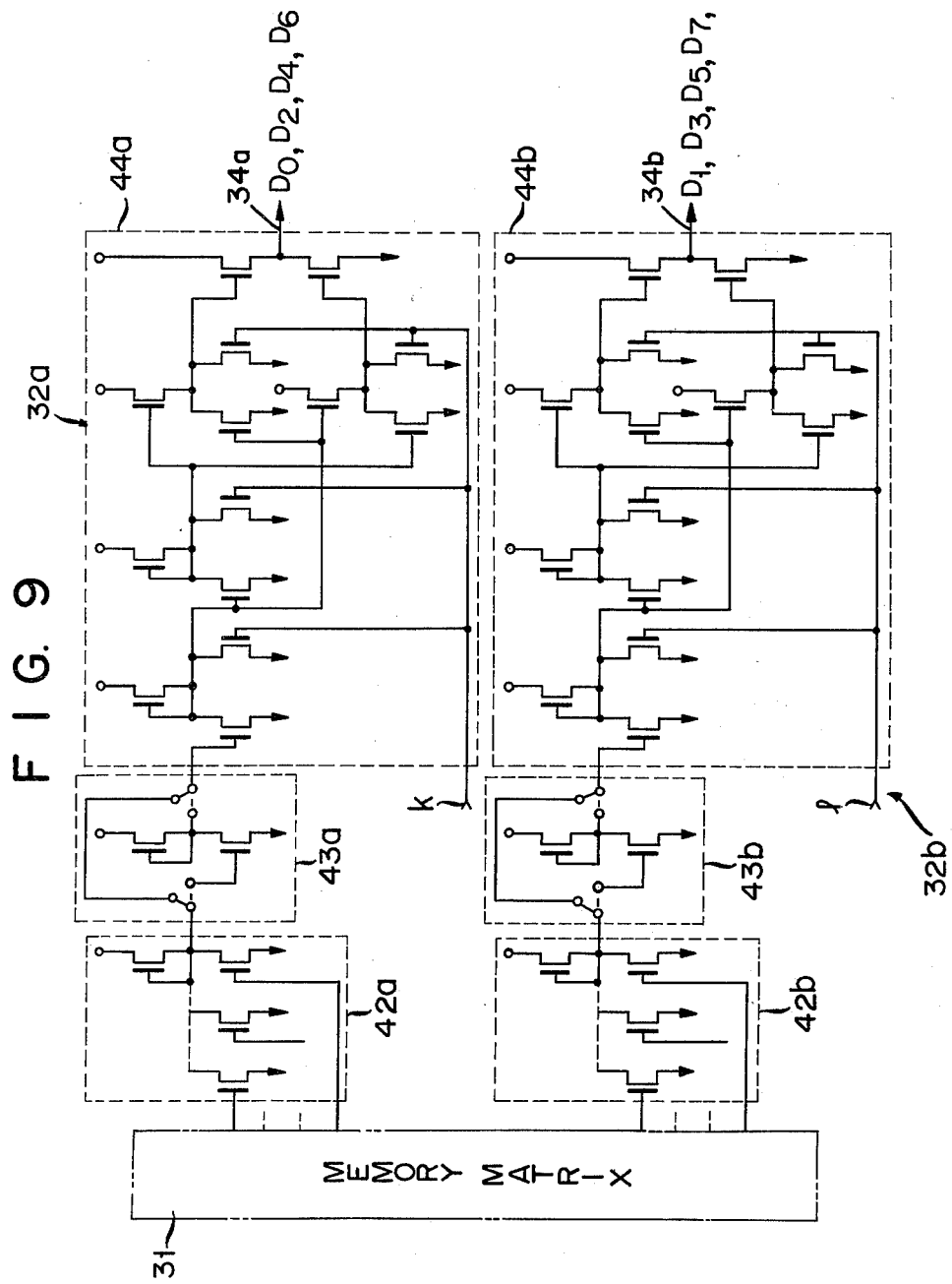

FIGS. 8A to 8F set forth the various forms in which the respective connection changeover circuit blocks included in the chip select circuit of FIG. 6 have the connection of the corresponding contacts switched over; and FIG. 9 shows a circuit diagram of the peripheral circuit of the ROM of FIG. 5.

Figure 1:
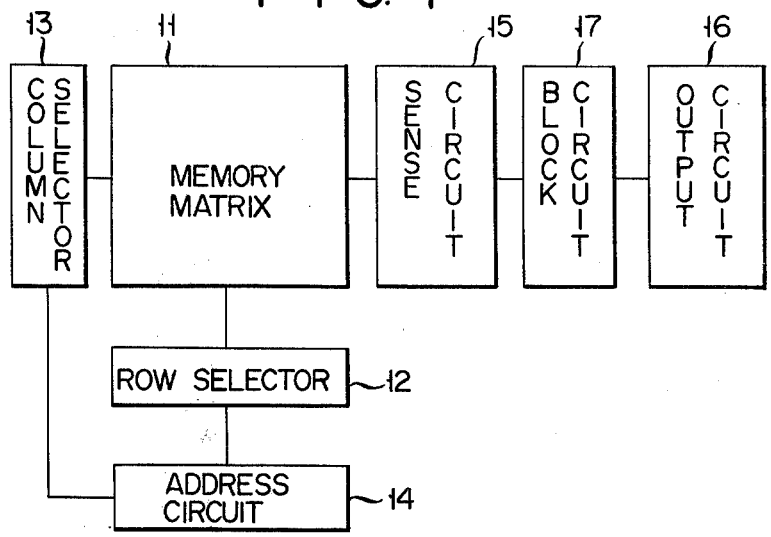
Figure 2:
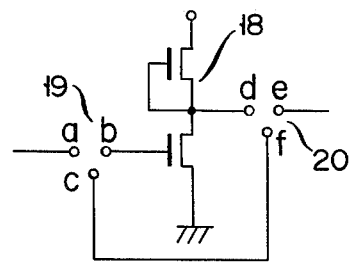

As apparent from FIG. 1, showing the block circuit diagram of a mask read only memory (M-ROM) according to one embodiment of this invention, a row selector 12 and column selector 13 are connected to a memory matrix 11 constituted by memory cells arranged in the form of a matrix. The row selector 12 and column selector 13 are designed to select the row and column addresses of the memory matrix 11 upon receipt of an address signal from an address circuit 14. The output terminal of the memory matrix 11 is connected to a sense circuit 15. A circuit block 17 is connected between the output terminal of the sense circuit 15 and an output circuit 16. The circuit block 17 is arranged as shown in FIG. 2, namely, comprises a logic level-converting circuit or inverter circuit 18 and contact sections 19, 20 connected to the input and output sections of the inverter circuit 18. The contact $a$ of the contact section 19 is connected to the output terminals of the sense circuit 15. The contact $b$ is connected to the input terminal of the inverter circuit 18. The contact $c$ is connected to the contact $f$ of the contact section 20. The contact $d$ of the contact section 20 is connected to the output terminal of the inverter circuit 18, and the contact $e$ thereof is connected to the input of the output circuit 16.

Figure 3A:
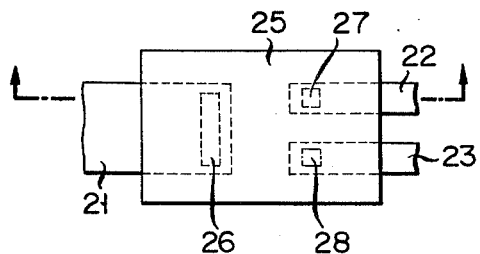
FIG. 3A is a plan view of the integrated contact section of the connection changeover circuit block of FIG. 2.
Figure 3B:
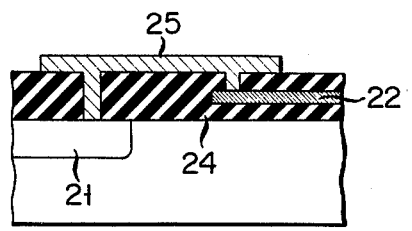
FIG. 3B is a sectional view thereof.

The contact section 19 of the circuit block 17 is formed on a ROM chip in order to have a semiconductor structure illustrated in FIGS. 3A and 3B. A diffusion area 21 is connected to a region (not shown) constituting the output section of the sense circuit 15 (FIG. 1). A polysilicon layer 22 is connected to a region constituting the input section of the inverter circuit 18 (FIG. 1). A diffusion region 23 is connected to a region (not shown) constituting the output circuit 16 through the contact section 20. A metal layer, for example, aluminium layer 25 is deposited on the semiconductor structure of the contact section 19 with an oxide film 24 interposed therebetween. Before the aluminium layer 25 is deposited, those portions of the oxide film 24 which face the diffusion region 21 and polysilicon layer 22 or diffusion region 23 are bored with openings 26 and 27 or 28. When part of the aluminium layer 25 is deposited, then the diffusion region 21 and polysilicon layer 22 or diffusion region 23 are connected together. Namely, where the openings 26, 27 are formed, the inverter circuit 18 (FIG. 2) is connected between the sense circuit 15 and output circuit 16 both shown in FIG. 1. Accordingly, an output signal from the sense circuit, that is, from the memory matrix 11 is supplied to the output circuit 16 with the logic level of the output signal reversed.

The boring of the contact sections 18 and 19 is undertaken at the same time as the formation of active elements each acting as a transistor in the memory matrix 11. The formation of active elements is carried out through the following steps. A paper tape is previously punched with information which the user desires to be stored in the memory matrix 11. The number of information bits having an active logic level, for example, a logic level of "1" and the number of information bits having a logic level of "0" are counted by means of an electronic computer. Where these numbers are determined, active elements are provided in the memory cells which correspond to information bits having a logic level of "1" or "0", whichever has a smaller number, for example, the memory cells which correspond to fewer information bits of "1" than those of "0". In this case, these are used information bits having a logic level of "1" which are read out of the memory matrix 11 with this logic level kept unchanged. The contact section 19, therefore, is bored with openings 26, 28 in order to connect together the regions 21, 23. Conversely where information bits having a logic level of "0" have a smaller number than those having a logic level of "1", namely, where information bits of "0" account for less than half the total number of the memory cells, then active elements are formed in those of the memory cells which correspond to the information bits of "0". In this latter case, information bits of "0" are read out of the memory matrix 11 in the form having a logic level of "1". Where, therefore, these information bits of "1" are sent forth from the output circuit 16, it is necessary to convert the logic level of "1" into that of "0". At this time, the contacts $a$, $b$ of the contact section 19 and contacts $d$, $e$ of the contact section 20 included in the circuit block 17 are connected together, thereby causing the inverter circuit 18 to be selectively connected between the sense circuit 15 and output circuit 16. Connection of the contacts $a$, $b$ is undertaken when the aluminium layer 25 is actuated after the openings 26, 27 are formed.

As described above, the circuit block 17 is provided to admit of the selective connection of the inverter circuit 18 between the sense circuit 15 and output circuit 16. Even where, therefore, the memory matrix 11 is stored with a larger number of information bits having a logic level of "1" than those having a logic level of "0", active elements need not be formed in those of the memory cells which correspond to a large number of information bits of "1", but may be provided in those of the memory cells which correspond to a small number of information bits of "0". Therefore, a semiconductor memory device can be manufactured with an increased yield and higher reliability during the formation of active elements.

Figure 4A:
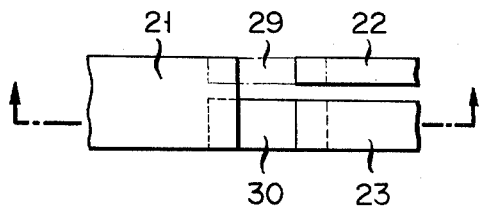
FIG. 4A is a plan view of a modification of the integrated contact section of the connection changeover circuit block of FIG. 2.
Figure 4B:
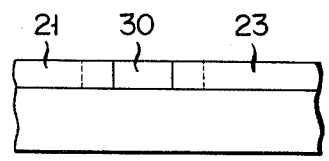
FIG. 4B is a sectional view thereof.

According to the embodiment of FIGS. 3A, 3B, the oxide film 24 is bored with openings for selective connection of the contacts $a$ and $b$ or $c$. As shown in FIGS. 4A and 4B, however, this connection may be effected by forming a connection diffusion region 29 or 30 between the diffusion region 21 and polysilicon layer 22 or diffusion region 23. In this case, the diffusion region 21 is directly connected to the polysilicon layer 22 during a formal wafer fabrication process.

There will now be described by reference to FIG. 5 a semiconductor memory device according to another embodiment of this invention which utilizes the switched-over connection of the contacts of the integrated contact section. With this embodiment, an ROM capable of being stored with 2,048 words of 8 bits and another ROM capable of being stored with 2,048 words X2 of 4 bits are manufactured through the common process from the start to a certain step. Connection changeover circuit blocks are formed on the chip on which a memory matrix is provided. In the step for writing in a ROM, a ROM unit of 8- or 4-bit type can be selectively produced as need arises by the switched-over connection of the contacts of the connection-changeover circuit block.

A semiconductor memory device thus manufactured is arranged as shown in the block circuit diagram of FIG. 5. A memory matrix 31 has a capacity of 16,384 bits. Peripheral circuits 32a, 32b are provided to enable the memory matrix to act as two ROM units each having a capacity to store 2,048 words of 4 bits. Each of these peripheral circuits 32a, 32b comprises a sense circuit 15, circuit block 17 and output circuit 16 shown in FIG. 1.

A chip selector circuit 35 successively picks up the alternate ones of a plurality of bits, for example, 8 bits stored in each address of the memory matrix 31, namely, is so designed as to send forth bits and in the form divided into two groups, that is, one group being formed of, for example, 4 bits $D_0$, $D_2$, $D_4$, $D_6$ and another group being formed of, for example, 4 bits $D_1$, $D_3$, $D_5$, $D_7$. Outputs corresponding to both groups of bits are delivered to external means through the peripheral circuits 32a, 32b from the corresponding terminals 34a, 34b. That is, two words can be read out of the same address of the memory matrix. When an 8 bit word is read out, bit signals $D_0$ to $D_7$ are read out at the same time.

The peripheral circuits 32a, 32b are controlled by an output signal from the chip selector circuit 35 selectively to send forth outputs corresponding to the above-mentioned two bit groups from the respective output terminals 34a, 34b. There will now be described the chip select circuit 35, which is arranged as shown in FIG. 6. The input terminals 36a, 36b, 36c of the chip select circuit 35 are supplied with chip select signals $C_{S1}$, $C_{S2}$, and $C_{S3}$ or $B_{S0}$. The chip select signals $C_{S1}$, $C_{S2}$ and $C_{S3}$ are used to handle information, each word of which is formed of 8 bits. The chip select signals $C_{S1}$, $C_{S2}$ and $B_{S0}$ are applied to handle information, each word of which is formed of 4 bits. The input terminals 36a, 36b and 36c supplied with the above-mentioned chip select signals are connected to inverter circuits 37a, 37b, 37c, respectively, each of which comprises three series-connected inverters $T_{12}$, $T_{34}$ and $T_{56}$ respectively formed on a pair of transistors $T_1$-$T_2$, $T_3$-$T_4$ and $T_5$-$T_6$.

The output terminals of the second and third inverters $T_{34}$ and $T_{56}$ of each of the inverter circuits 37a, 37b, 37c are connected to the contacts A, B respectively of connection changeover circuit blocks 38a, 38b, 38c. The neutral contacts of the connection changeover circuit blocks 38a, 38b are connected to the input terminals of an NOR gate 39a included in a logic level control circuit 39. An output from the NOR gate 39a is conducted to an inverter 39b and also to an inverter 40a of a logic level control circuit 40. The neutral contact of the connection changeover circuit block 38c is connected to the neutral contact of the connection changeover circuit block 38d whose contacts C, D are respectively connected to the input terminal of an inverter 41 and the input terminal of the NOR gate 39c of the logic level control circuit 39. The output terminal of the inverter 41 is connected to the contact E of a connection changeover circuit block 38e, whose contact F is connected to the contact D of the connection changeover circuit block 38d. The neutral contact of the connection changeover circuit block 38e is connected to the input terminal of the NOR gate 40b of the logic level control circuit 40. Where the chip select circuit 35 arranged as shown in FIG. 6 is integrated, the connection changeover circuit blocks 38a to 38e are formed on the periphery of a chip or those portions thereof which remain unoccupied. The connection changeover circuit blocks 38a to 38e are formed in a form of non-connection. Where information is to be stored in the ROM, then the contacts of the required ones of these circuit blocks are connected.

Figure 7:
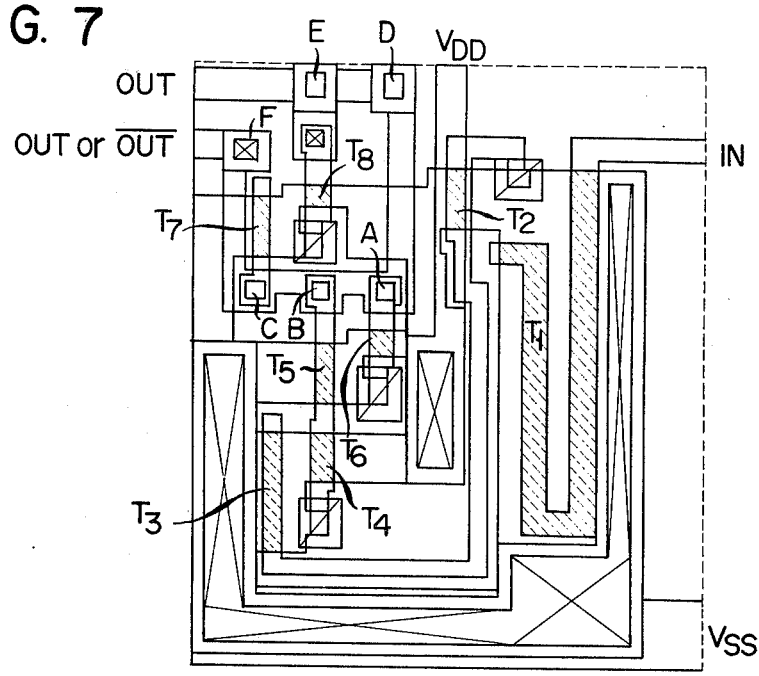
FIG. 7 shows a fraction of an integrated circuit pattern of the chip select circuit of FIG. 6.

FIG. 7 shows the pattern of that region of a chip on which there are formed the inverter circuit 37c supplied with a chip select signal $C_{S3}$ or $B_{S0}$, the associated connection changeover circuit blocks 38c to 38e, and inverter 41. The references given in FIG. 7 correspond to those of FIG. 6 and denote the elements shown therein.

The arrangement of the chip select circuit 35 is defined according to whether the ROM is designed to store information as 8-bit words or as 4-bit words in conformity to a user's specification. Where the ROM is to store information as 8-bit words, then the contacts A, B of each of the connection changeover circuit blocks 38a, 38b (FIG. 6) are connected as shown in FIG. 8A or FIG. 8B according to whether the chip select signals $C_{S1}$, $C_{S2}$ have a logic level of "0" or "1". Depending on the logic level of the chip select signal $C_{S3}$, the contacts A, B of the circuit block 38c, the contacts C, D of the circuit block 38d and the contact F of the circuit block 38e are connected as indicated in FIG. 8C or FIG. 8D. Conversely where the memory matrix 31 is demanded to store information as 4-bit words, then the contacts A, B of each of the circuit blocks 38a, 38b are connected in the same manner as in the case where the memory matrix 31 stores information as 8-bit words. The contacts A, B of the circuit block 38c, the contacts C, D of the circuit block 38d and the contacts E, F of the circuit block 38e are connected as shown in FIG. 8E or FIG. 8F, according to whether a chip select signal $B_{S0}$ has a logic level of "0" or "1".

There will now be described the operation of the chip select circuit 35. Signals appearing on output lines g, h of FIG. 6 always have a logic level of "0", regardless of whether the chip select signals $C_{S1}$, $C_{S2}$ have a logic level of "0" or "1". Where information, each word of which has 8 bits is to be read out of the memory matrix 31, then the contacts of the connection changeover circuit blocks 38c, 38d, 38e are connected as shown in FIGS. 8C and 8D. In this case, signals appearing on output lines i, j shown in FIG. 6 have a logic level of "0". As the result, signals having a logic level of "0" are sent forth from the output lines k, l of the chip select circuit 35. In contrast, where information of 4-bit words is to be read out of the memory matrix, then signals having logic levels of "0" and "1" respectively, or logic levels of "1" and "0" respectively appear on the output lines i, j, according as the chip select signal $B_{S0}$ has a logic level of "0" or "1". As the result, signals having logic levels of "0" and "1" or "1" and "0" appear on the output lines k, l from the circuit 35, depending on the logic levels of signals of the output lines i, j. Signals sent forth from the output lines k, l are delivered to the peripheral circuits 32a, 32b. These peripheral circuits 32a, 32b are so controlled as to cause the information bits of the even order to be issued from the output terminal 34a of the peripheral circuit 32a and the information bits of the odd order to be sent forth from the output terminal 34b of the peripheral circuit 32b.

FIG. 9 shows the arrangement of the peripheral circuits 32a, 32b which are controlled by an output signal from the chip select circuit 35. The even numbered bit memory section 32a of the memory matrix 31 is connected to the corresponding sense circuit 42a, and the odd numbered bit memory section 32b thereof to the corresponding sense circuit 42b. The output sections of the sense circuits 42a, 42b are connected to output circuits 44a, 44b respectively through the corresponding connection changeover circuit blocks 43a, 43b, each of which has the same circuit arrangement as shown in FIG. 2 and comprises an inverter and contacts for selectively actuating the inverter. The peripheral circuits 32a, 32b are so designed that data signals read out of the memory matrix 31 upon receipt of a chip select signal from the chip select circuit 35 (FIG. 5) in the form of two 4-bit groups, that is, a first group formed of 4 bits $D_0$, $D_2$, $D_4$, $D_6$ and a second group formed of 4 bits $D_1$, $D_3$, $D_5$, $D_7$ are supplied to the output circuits 44a, 44b respectively through the corresponding connection changeover circuit blocks 43a, 43b. For example, where chip select signals k, l delivered from the chip select circuit 35 have a logic level of "0" alike, then information of 8-bit words is issued from the output terminals 34a, 34b of the peripheral circuits 32a, 32b. Where a chip select signal k sent forth from the chip select circuit 35 has a logic level of "0" and a chip select signal l delivered from the chip select circuit 35 has a logic level of "1", then information of 4-bit words is issued from the output terminal 34a of the peripheral circuit 32a.

With a semiconductor memory device according to a second embodiment of this invention described by reference to FIGS. 5 to 9, active elements are formed in those of the memory cells which correspond to a smaller number of information bits being stored in the memory matrix 31 which have a logic level of "1" or "0". Where information bits having a logic level of, for example, "1" are fewer than those having a logic level of "0", and active elements are formed in those of the memory cells which correspond to the "1" level information bits, then the contacts of the connection changeover circuit blocks 43a, 43b are so connected as to enable bit signals read out to be used with the output logic levels kept unchanged. Conversely, where information bits having a logic level of "0" have a smaller number than those having a logic level of "1" and active elements are formed in those of the memory cells which correspond to the "0" level information bits, then the contacts of the connection changeover circuit blocks 43a, 43b are so connected as to cause an inverter circuit included in each of the circuit blocks 43a, 43b to be connected between the corresponding sense circuit and output circuit. Connection of the contacts of the circuit blocks 43a, 43b is carried out at the same time as the writing step of information bits in the memory matrix 31. In manufacturing the different types of ROMs storing 4 bit words or 8 bit words according to the user's specification, the same process is undertaken. In the writing step of the ROM, the contacts of the connection changeover circuit blocks 38a to 38e are so connected as to render the ROM adapted to store information, each word of which has the prescribed number of bits. Therefore, different types of semiconductor memory devices can be provided simply by changing the mask in the writing process without changing the manufacturing process itself.

As described above, incorporation of connection changeover circuit blocks embodying this invention enables different types of semiconductor memory devices to be manufactured by the same process with an increased yield and higher reliability.

What we claim is:

1. A method of manufacturing a semiconductor binary read only memory device which comprises the steps of counting the number of information bits having a logic level of "1" and the number of information bits having a logic level of "0" to be stored in said semiconductor read only memory device; forming on a semiconductor chip a memory matrix having a plurality of memory cells constructed to represent the "0" logic level, a logic level converting circuit for inverting the logic level of bits read out of said memory, and a connection changeover circuit normally remaining contactless between said memory cells and said logic level converting circuit; forming active elements in those of the memory cells which correspond to the information bits representing the logic level having fewer than half the total number of information bits to be stored in said memory; and connecting the contacts of said connection changeover circuit to connect said memory cells to the logic level converting circuit when the active elements formed in said memory cells represent the "0" logic level.

2. A method of manufacturing a semiconductor memory device according to claim 1 wherein the steps for forming active elements and connecting the contacts are carried out at the same time by using a mask.

* * * * *